United States Patent

Tsukada et al.

[11] Patent Number: 5,116,694
[45] Date of Patent: May 26, 1992

[54] COATED CEMENTED CARBIDES

[75] Inventors: Hiroshi Tsukada; Masaaki Tobioka; Toshio Nomura; Yasuhiro Saito, all of Itami, Japan

[73] Assignee: Sumitomo Electric Industries, Ltd., Osaka, Japan

[21] Appl. No.: 709,786

[22] Filed: Jun. 3, 1991

Related U.S. Application Data

[63] Continuation of Ser. No. 246,950, Sep. 16, 1988, abandoned, which is a continuation of Ser. No. 110,034, Oct. 15, 1987, abandoned, which is a continuation of Ser. No. 816,722, Dec. 31, 1985, abandoned.

[30] Foreign Application Priority Data

Jan. 21, 1985 [JP] Japan ............................ 60-9754

[51] Int. Cl.$^5$ .............................................. C23C 28/04
[52] U.S. Cl. ........................... 428/698; 428/216; 428/220; 428/688; 428/689; 428/699; 428/704
[58] Field of Search .......... 428/698, 699, 689, 688, 428/704, 216, 220

[56] References Cited

U.S. PATENT DOCUMENTS

| | | | |
|---|---|---|---|
| Re. 32,111 | 5/1986 | Lambert et al. | 428/698 |
| 3,640,689 | 2/1972 | Glaski et al. | 29/195 |
| 4,239,536 | 12/1988 | Yamamoto et al. | 428/379 |
| 4,336,277 | 6/1982 | Banshah et al. | 427/38 |
| 4,402,994 | 9/1983 | Kobayashi et al. | 427/38 |
| 4,497,874 | 2/1985 | Hale | 428/551 |
| 4,507,189 | 3/1985 | Doi et al. | 427/39 |
| 4,675,206 | 6/1987 | Ikegaya et al. | 427/38 |
| 4,686,156 | 8/1987 | Baldoui et al. | 428/698 |
| 4,720,437 | 1/1988 | Chudo et al. | 428/698 |
| 4,776,863 | 10/1988 | van den Berg | 428/698 X |

FOREIGN PATENT DOCUMENTS

| | | | |
|---|---|---|---|
| 0031805 | 7/1981 | European Pat. Off. | 428/698 |
| 1954366 | 6/1971 | Fed. Rep. of Germany . | |
| 2415668 | 8/1979 | France . | |
| 52-10870 | 1/1977 | Japan . | |
| 0153770 | 9/1983 | Japan | 428/698 |
| 0153773 | 9/1983 | Japan | 428/698 |
| 0157965 | 9/1983 | Japan | 428/698 |
| 0039784 | 3/1984 | Japan | 428/698 |
| 59-18474 | 4/1984 | Japan . | |
| 0056564 | 3/1987 | Japan | 428/698 |
| 0643166 | 5/1984 | Switzerland | 428/698 |
| 762931 | 12/1956 | United Kingdom . | |
| 1601224 | 10/1981 | United Kingdom | 428/698 |

OTHER PUBLICATIONS

"A High Rate Sputtering Process for the Formation of Hard Friction-Reducing TiN Coatings on Tools", Münz et al., Thin Solid Films 96 (1982) 79-86.
"Coated Hardmetals in the Machine Shop", Schedler, 768 Engineers' Digest, vol. 38, No. 8 (Aug. 1977).
Schintlmeister et al.; Cutting Tool Materials Coated by CVD, Wear, vol. 100, 1984, pp. 153-169.

Primary Examiner—Ellis P. Robinson
Assistant Examiner—Archene Turner
Attorney, Agent, or Firm—Wenderoth, Lind & Ponack

[57] ABSTRACT

A coated cemented carbide with an improved wear resistance without lowering the toughness as a tool is provided comprising a substrate of a cemented carbide, the surface of which is coated with a multilayer of TiC, TiN and TiCN by the PVD method, the innermost layer in contact with the substrate being a TiN layer with a thickness of 0.1 to 1 μm.

5 Claims, 1 Drawing Sheet

COATED CEMENTED CARBIDES

This application is a continuation of now abandoned application, Ser. No. 07/246,950 filed Sep. 16, 1988, which is a continuation of now abandoned application, Ser. No. 07/110,034 filed Oct. 15, 1987, which is a continuation of now abandoned application, Ser. No. 06/816,722 filed Dec. 31, 1985 now is abandoned.

BACKGROUND OF THE INVENTION

1. Field of the Invention

This invention relates to coated cemented carbides and more particularly, it is concerned with coated cemented carbides having a hard coating film structure of increased wear resistance as well as high toughness, used as cutting tools.

2. Description of the Prior Art

The requirement of a higher wear resistance for cemented carbides used for cutting tools is increasing each year. Thus, it has hitherto been proposed to coat cemented carbides with single layers or multilayers of TiC, TiCN, TiN, $Al_2O_3$, and the like by chemical vapor deposition methods (which will hereinafter be referred to as CVD method) as described in, for example, Japanese Patent Publication No. 24982/1976. It has also been proposed to coat cemented carbides with single layers or multilayers of TiC, TiCN, TiN and the like by physical vapor deposition methods (which will hereinafter be referred to as PVD method) as described in, for example, Japanese Patent Publication No. 18474/1984.

In these coated cemented carbides, however, the surface of the cemented carbides such as WC-TiC-Co, as a substrate, is coated with a material with a higher hardness but more brittleness than the cemented carbides and accordingly, there arises the problem that the toughness is lowered as a whole and when used as a cutting tool, the cutting edge tends to break with fluctuation of load stress. Furthermore, it is known that the toughness is lowered to a greater extent when the coated cemented carbide has a larger bonding strength between the substrate and coating film.

In the case of coated cemented carbides produced by the CVD method, in general, the lowering of the toughness is greater because the coating temperature is ordinarily higher, e.g. 1000° C., resulting in reaction of the substrate and coating film or coarsening of the grain size of the film itself. On the contrary, in the case of coated cemented carbides produced by the PVD method, the lowering of the toughness is less than in the case of the CVD method because the coating temperature is lower, e.g. 200° to 700° C. than in the case of the CVD method, thus resulting in suppression of the reaction between the substrate and coating film and maintaining a finer grain size of the film itself. Therefore, the coated cemented carbides produced by the PVD method have been used for milling cutters with many repetitions, more than those by the CVD method.

A cemented carbide coated with only TiN, such as the coated cemented carbide produced by the PVD method, is inferior in flank wear because TiN itself has a lower hardness than TiC. A cemented carbide coated with only TiC is excellent in flank wear, but inferior in crater depth because of its lower chemical reaction resistance. Accordingly, many efforts to make the best use of only the strong points thereof have been made by coating TiCN having intermediate properties between TiC and TiN or by coating these materials in laminated layers or multilayer. In the case of coating such a multilayer, it is preferable to arrange a TiN layer at a position in direct contact with a workpiece to be cut, i.e. as an outermost layer so as to utilize its excellent chemical reaction resistance, and to position a TiC layer excellent in flank wear inside the TiN layer. In the case of providing a TiCN layer, it is preferable to position it between a TiC layer and a TiN layer as an outermost layer. The reason therefor is that TiCN, having intermediate properties between TiC and TiN, should be positioned inside the outermost layer in order to hold the effect of TiN as the outermost layer, and outside the TiC layer in order to make the best use of the TiN-like properties of TiCN. Therefore, film structures such as cemented carbide/TiC/TiN and cemented carbide/TiC/TiCN/TiN have hitherto been considered suitable in order to impart resistances to flank wear and crater depth.

However, the inventors have found that the above described film structure has a problem with respect to another important property for cutting tools, i.e. toughness. That is to say, the problem is that when a TiC layer is contacted with a cemented carbide alloy as a substrate, a diffusion takes place between WC contained in the substrate and TiC as the coating layer even in the PVD method wherein coating is possible at a lower temperature than in the CVD method, and the bonding strength is thus increased but the toughness, as a tool, is lowered to result in increased breakage, in particular, in use under conditions wherein load fluctuations occur frequently.

SUMMARY OF THE INVENTION

It is an object of the present invention to provide novel coated cemented carbides excellent in wear resistance (flank wear, crater depth) as well as toughness, whereby the above described disadvantages of the prior art can be overcome.

It is another object of the present invention to provide a cemented carbide alloy coated with a multilayer of TiC, TiN and TiCN by the PVD method.

These objects can be attained by a coated cemented carbide, comprising a substrate of cemented carbide the surface of which is coated with a multilayer of TiC, TiN and TiCN by the PVD method, the innermost layer in contact with the substrate being a TiN layer with a thickness of 0.1 to 1 μm.

BRIEF DESCRIPTION OF THE DRAWING

The accompanying drawing illustrates the principle and merits of the invention in greater detail.

DETAILED DESCRIPTION OF THE INVENTION

Figure 1:
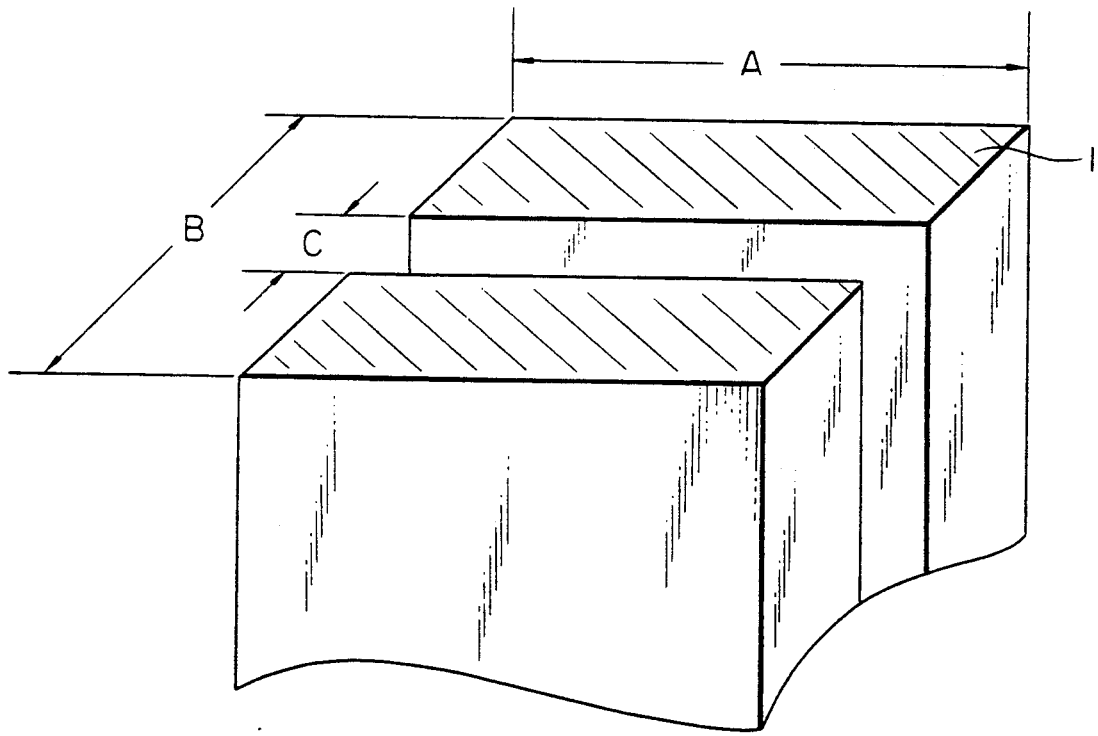
FIG. 1 is a perspective view of a workpiece used in a heavy milling test in one embodiment of the present invention.

The inventors have made various efforts to solve the problems of the prior art and consequently, have found that if a TiN layer is caused to exist between a substrate of cemented carbide alloy and a TiC layer for a different purpose from that of the outermost TiN layer, that is, for the purpose of lowering the bonding strength with the substrate to a suitable extent, the toughness of the tool is markedly increased. This effect is considered to be due to the fact that TiN is different from TiC and is not so reactive with WC in the substrate.

The process of causing a TiN layer to exist between a cemented carbide alloy and TiC layer by the CVD method has been known as described in, for example, U.S. Pat. No. 3,640,689 in which it is particularly described that the PVD method is not suitable in respect of the quality of the film. However, it is found by our studies for a long time that the presence of a TiN layer formed by the PVD method results in unexpected effects.

Accordingly, the present invention provides a coated cemented carbide comprising a substrate of cemented carbide, the surface of which is coated with a multilayer of TiC, TiN and TiCN by the PVD method, the innermost layer adjacent to the substrate being a TiN layer with a thickness of 0.1 to 1 μm.

In the present invention, the first layer of TiN is provided not for the purpose of utilizing the wear resistance of the TiN layer itself, but for controlling the bonding strength between the substrate and second or further layers, and therefore, it does not need a large thickness. The thickness of the first layer of TiN (innermost layer adjacent to the substrate) should be 0.1 to 1 μm, since if less than 0.1 μm, there is no effect of suitably lowering the bonding strength and the film cannot be observed as a continuous phase, while if more than 1 μm, the effect of the film quality of TiN itself appears to lower the flank wear.

Preferably, the film thickness of the second layer of TiC or TiCN adjacent to the above described first layer is 0.1 μm to 5 μm, since if less than 0.1 μm, there is no effect of improving the flank wear, while if more than 5 μm, the tool is brittle as a whole.

In the case of coating TiC as the second layer and TiCN as the third layer, the TiCN layer should not be more than 5 μm, since otherwise the tool becomes brittle. In the case of coating TiN as the outermost layer, the thickness thereof is preferably in the range of 0.3 to 5 μm, since if less than 0.3 μm, there is no effect of improving the crater depth, while if more than 5 μm, the wear resistance is decreased.

The total thickness of the coating films is preferably in the range of 1 to 10 μm, since if less than 1 μm, the wear resistance is not improved, while if more than 10 μm, the tool is brittle.

The feature of the present invention consists in using the PVD method as the coating method. The PVD method can be carried out by any of the known methods classified widely as the PVD method, for example, ion plating methods, sputtering methods or vaccum vapor deposition methods using, as evaporation sources, electron beam, hollow cathode gun or arc discharge. These methods can be used individually or in combination.

The following examples are given in order to illustrate the present invention in detail without limiting the same.

EXAMPLE 1

A cemented carbide alloy (ISO P 30) was machined into a throwaway insert with a form of SPG 422 and subjected to coating by the ion plating method to prepare various coated cemented carbides as shown in Table 1.

Identification and measurement of the film thickness were carried out as to the coating films shown in Table 1 by polishing the cross section of the coating and observing by EPMA and an optical microscope.

The thus resulting coated cemented carbides were then subjected to a milling wear resistance test and toughness test by heavy milling (diameter of 125 mm) as shown in FIG. 1, under conditions shown in Table 2, thus obtaining results shown in Table 1. In FIG. 1, a workpiece has a dimension of A 150 mm and B 100 mm and a cut groove C of 10 mm, and 1 is the surface of the work face.

As is evident from the results of this example, Sample Nos. 1 to 3 are best in wear resistance and toughness (breakage ratio).

TABLE 1

| | Coating Films (film thickness in μm) | | | | | | | Wear Resistance | | Toughness |
|---|---|---|---|---|---|---|---|---|---|---|
| | First Layer | | | Second Layer | | Third Layer | Outermost Layer | Total | Flank | Crater | (breakage |
| Sample No. | TiN | TiCN | TiC | TiC | TiCN | TiCN | TiN | Thickness | Wear (mm) | Depth (mm) | ratio %) |
| 1 | 0.2 | | | 2.0 | | | 1.5 | 3.7 | 0.10 | 0.005 | 5 |
| 2 | 0.3 | | | 1.0 | | 1.5 | 1.0 | 3.8 | 0.11 | 0.005 | 7 |
| 3 | 0.8 | | | 1.0 | | 1.0 | 1.0 | 3.8 | 0.11 | 0.005 | 7 |
| 4 | | | | 2.0 | | | 1.5 | 3.5 | 0.10 | 0.005 | 40 |
| 5 | | | | 1.0 | 1.5 | | 1.0 | 3.5 | 0.11 | 0.006 | 30 |
| 6 | | 2.5 | | | | | 1.0 | 3.5 | 0.15 | 0.005 | 35 |
| 7 | 0.05 | | | 2.0 | | | 1.5 | 3.55 | 0.11 | 0.005 | 38 |
| 8 | 2.0 | | | 1.0 | | | 0.8 | 3.8 | 0.22 | 0.004 | 6 |
| 9 | 0.3 | | | 0.3 | | | 3.0 | 3.6 | 0.33 | 0.05 | 6 |
| 10 | 0.3 | | | 7.0 | | | 0.5 | 7.8 | 0.09 | 0.011 | 50 |
| 11 | 0.3 | | | 1.0 | | 6.0 | 0.5 | 7.8 | 0.11 | 0.008 | 45 |
| 12 | 0.3 | | | 3.0 | | | 0.1 | 3.4 | 0.11 | 0.018 | 7 |
| 13 | 0.3 | | | 0.5 | | | 7.0 | 7.8 | 0.28 | 0.005 | 20 |
| 14 | 0.2 | | | 0.4 | | | 0.2 | 0.8 | 0.42 | 0.080 | 4 |
| 15 | 0.3 | | | 6.0 | | | 6.0 | 12.8 | 0.09 | 0.005 | 60 |

Note:
Sample Nos. 4 to 8 for comparison

TABLE 2

| | Wear Resistance | Toughness |
|---|---|---|
| Workpiece | SCM 435 (Hs 38) | SCM 440 ($H_R$ C 40) |
| Cutter | 160 dia. (one tooth) | 125 dia. (one tooth) |
| Cutting Speed | 124 m/min | 125 m/min |
| Cutting Depth | 2 mm | 3 mm |
| Feed | 0.19 mm/tooth | 0.50 mm/tooth |
| Cutting Time | 40 min | 2 min |
| Repetition Number | 1 corner | 8 corners |

EXAMPLE 2

Coated cemented carbides shown in Table 3 were prepared in an analogous manner to Example 1 and then subjected to tests of wear resistance and toughness in an analogous manner and conditions to Example 1, thus obtaining results shown in Table 3. It is apparent from the results of this example that Sample Nos. 21 to 25 according to the present invention give best results in wear resistance and toughness.

TABLE 3

| Sample Nos. | | Coating Films (film thickness in μm) | | | | | | | | | Wear Resistance | | Toughness |
|---|---|---|---|---|---|---|---|---|---|---|---|---|---|
| | | First Layer | | | Second Layer | | | Third Layer | | | Total | Flank | Crater | (breakage |
| | | TiN | TiCN | TiC | TiN | TiCN | TiC | TiN | TiCN | TiC | Thickness | Wear (mm) | Depth (mm) | ratio %) |
| Present Invention | 21 | 0.2 | | | | 3.0 | | | | | 3.2 | 0.13 | 0.009 | 5 |
| | 22 | 0.3 | | | | | 3.0 | | | | 3.3 | 0.11 | 0.018 | 7 |
| | 23 | 0.2 | | | | 1.5 | | | | 1.5 | 3.2 | 0.12 | 0.013 | 8 |
| | 24 | 0.2 | | | | | 1.5 | | 1.5 | | 3.2 | 0.12 | 0.013 | 4 |
| | 25 | 0.3 | | | | 2.0 | | 1.0 | | | 3.3 | 0.14 | 0.006 | 6 |
| Comparison | 26 | | 3.0 | | | | | | | | 3.0 | 0.13 | 0.009 | 35 |
| | 27 | | | 3.0 | | | | | | | 3.0 | 0.11 | 0.018 | 42 |
| | 28 | | 1.5 | | | | 1.5 | | | | 3.0 | 0.12 | 0.013 | 45 |
| | 29 | | | 1.5 | | 1.5 | | | | | 3.0 | 0.12 | 0.013 | 30 |
| | 30 | | 2.0 | | 1.0 | | | | | | 3.0 | 0.14 | 0.006 | 33 |
| | 31 | 0.05 | | | | | 1.5 | | 1.5 | | 3.05 | 0.12 | 0.013 | 30 |
| | 32 | 2.0 | | | | | 1.0 | | 1.0 | | 4.0 | 0.21 | 0.009 | 6 |

EXAMPLE 3

A commercially available endmill made of a cemented carbide was coated with a TiCN layer of about 3 μm in thickness by a sputtering method, after a TiN layer of 0.3 μm in thickness was previously coated, to prepare a coated cemented carbide according to the present invention. This sample had a similar wear resistance to a comparative sample coated with only the TiCN layer, but was more excellent in wear resistance as shown by less breakage, i.e. 1/5 time that of the comparative sample.

What is claimed is:

1. A coated cemented carbide comprising a substrate of a cemented carbide, the surface of which is coated with a multilayer coating having a total thickness of 1 to 10 μm, formed by a PVD method, consisting of:
   an innermost layer of TiN having a thickness of 0.1 to 0.8 in contact with said substrate,
   at least one layer selected from the group consisting of a TiC layer and a TiCN layer having a total thickness of 1 to 5 μm in contact with said innermost layer, wherein when both said TiC and TiCN layers are present, said TiC layer is in contact with said innermost layer, and optionally
   an outermost layer of TiN having a thickness of 0.3 to 5 μm.

2. The coated cemented carbide of claim 1, wherein the multilayer coating consists of a first layer of TiN, second layer of TiC and third layer of TiCN.

3. The coated cemented carbide of claim 1, wherein the multilayer coating consists of a first layer of TiN, second layer of TiC and third layer of TiN.

4. The coated cemented carbide of claim 1, wherein the multilayer coating consists of a first layer of TiN, second layer of TiCN and third layer of TiN.

5. The coated cemented carbide of claim 1, wherein the multilayer coating consists of a first layer of TiN, second layer of TiC, third layer of TiCN and fourth layer of TiN.

* * * * *